United States Patent
Kye et al.

(10) Patent No.: US 7,668,011 B2
(45) Date of Patent: Feb. 23, 2010

(54) SERIAL FLASH MEMORY DEVICE AND PRECHARGING METHOD THEREOF

(75) Inventors: Hun Woo Kye, Icheon-si (KR); Jong Bae Jeong, Icheon-si (KR); Seung Duck Kim, Seongnam-si (KR); Sang Yong Lee, Icheon-si (KR); Ki Won Kwon, Yongin-si (KR); Seung Keun Lee, Yongin-si (KR)

(73) Assignee: Excel Semiconductor Inc., Seongnam-si, Gyeonggi-do (KR)

( * ) Notice: Subject to any disclaimer, the term of this patent is extended or adjusted under 35 U.S.C. 154(b) by 153 days.

(21) Appl. No.: 12/065,456

(22) PCT Filed: Sep. 11, 2006

(86) PCT No.: PCT/KR2006/003608
§ 371 (c)(1),
(2), (4) Date: Feb. 29, 2008

(87) PCT Pub. No.: WO2007/029990
PCT Pub. Date: Mar. 15, 2007

(65) Prior Publication Data
US 2008/0304321 A1 Dec. 11, 2008

(30) Foreign Application Priority Data
Sep. 9, 2005 (KR) .................. 10-2005-0084296

(51) Int. Cl.
*G11C 16/04* (2006.01)
(52) U.S. Cl. ............... 365/185.13; 365/185.25; 365/185.33
(58) Field of Classification Search ............ 365/185.13, 365/185.21, 185.25, 185.05, 185.33
See application file for complete search history.

(56) References Cited

U.S. PATENT DOCUMENTS

| | | | | |
|---|---|---|---|---|
| 4,174,536 A | * | 11/1979 | Misunas et al. | 710/1 |
| 6,236,430 B1 | * | 5/2001 | Suzuki et al. | 348/219.1 |
| 6,317,812 B1 | * | 11/2001 | Lofgren et al. | 711/154 |
| 6,856,546 B2 | | 2/2005 | Guterman et al. | |
| 6,930,924 B2 | | 8/2005 | Takase et al. | |
| 2004/0165431 A1 | | 8/2004 | Guterman et al. | |
| 2007/0127297 A1 | * | 6/2007 | Ishii | 365/189.05 |
| 2008/0123423 A1 | * | 5/2008 | Kim | 365/185.11 |

OTHER PUBLICATIONS

International Search Report for PCT/KR2006/003608 dated Jan. 16, 2007.
Written Opinion for PCT/KR2006/003608 dated Jan. 16, 2007.

* cited by examiner

*Primary Examiner*—Gene N. Auduong
(74) *Attorney, Agent, or Firm*—Jae Y. Park; Kile Goekjian Reed & McManus PLLC

(57) ABSTRACT

Provided herein is a serial flash memory device and precharging method thereof in which a single local bit-line data is sensed in synchronization with a clock. The method includes precharging two or more local bit-lines in synchronization with a first clock; and disprecharging one of the two local bit-lines in synchronization with a second clock and sensing and amplifying data of the other local bit-line. Accordingly, two precharged local bit-lines are not adjacent to each other, thereby eliminating a coupling noise effect. In addition, the time for performing the precharging operation and the sensing operation is easily secured, compared to the prior precharging method in which corresponding local bit-lines are precharged at every clock.

9 Claims, 14 Drawing Sheets

[Fig. 1]
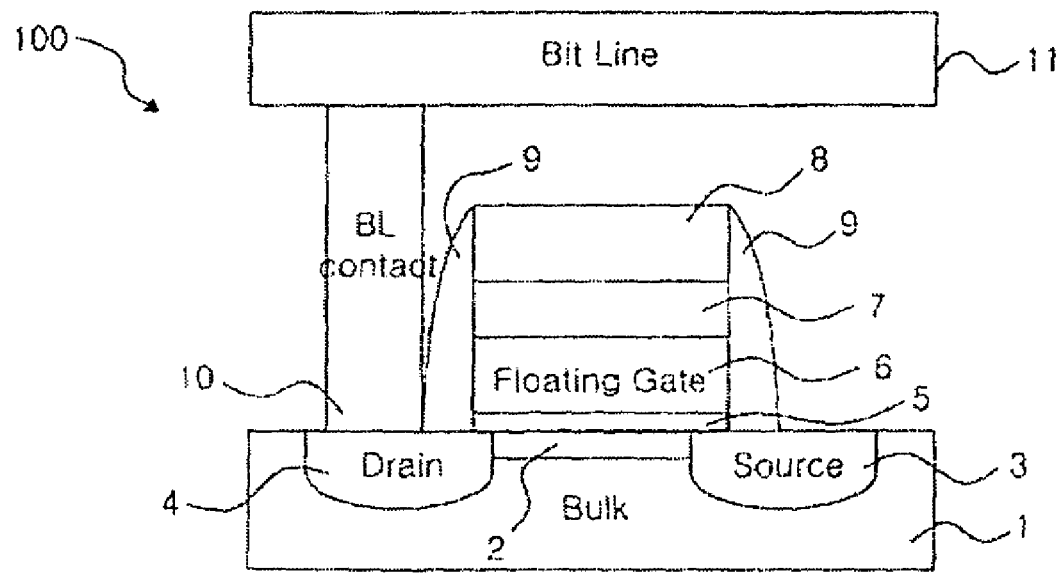
[Fig. 2]
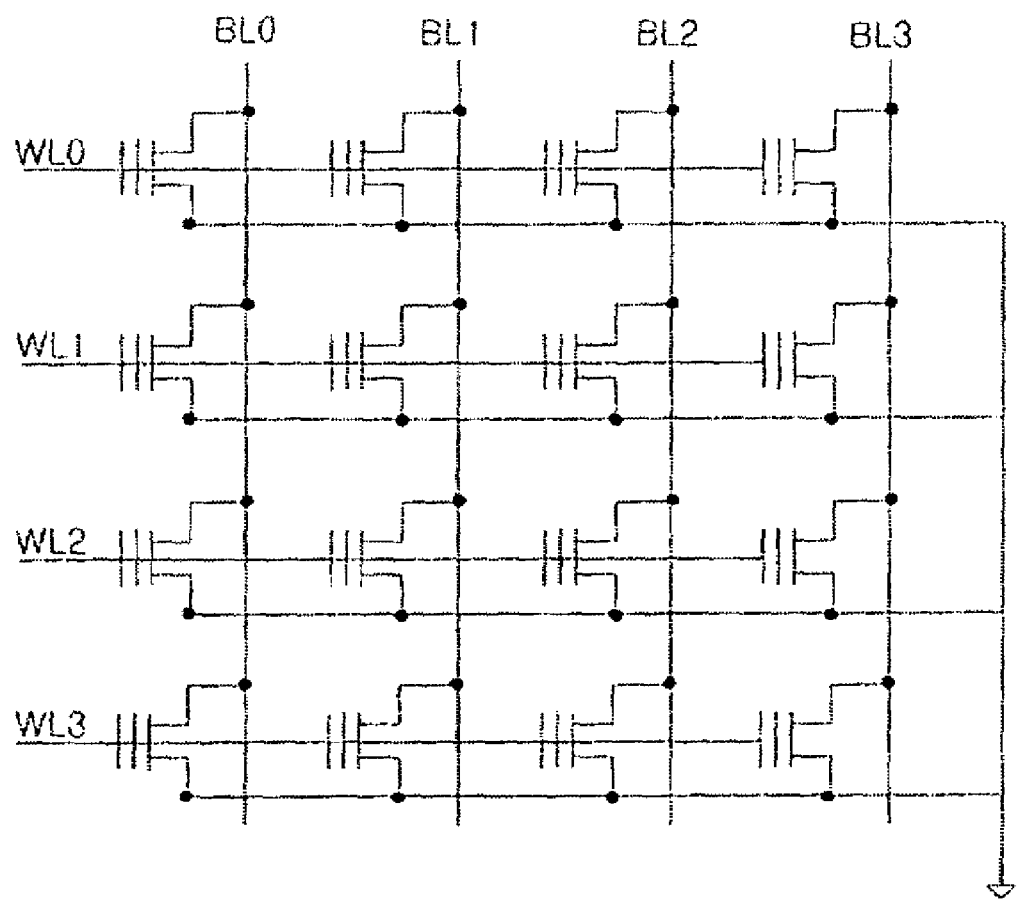

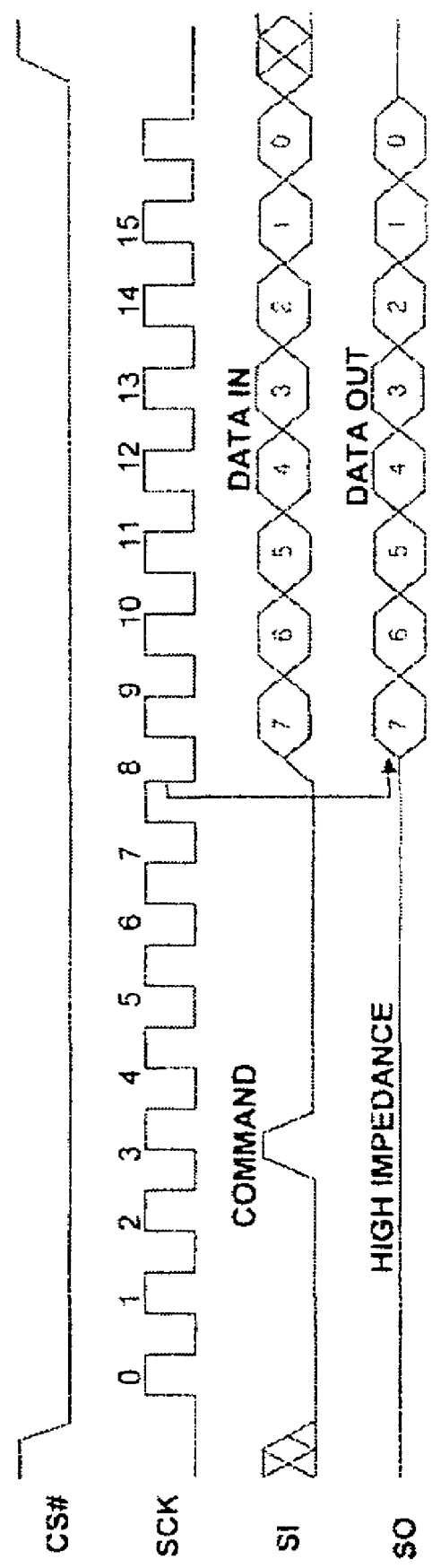

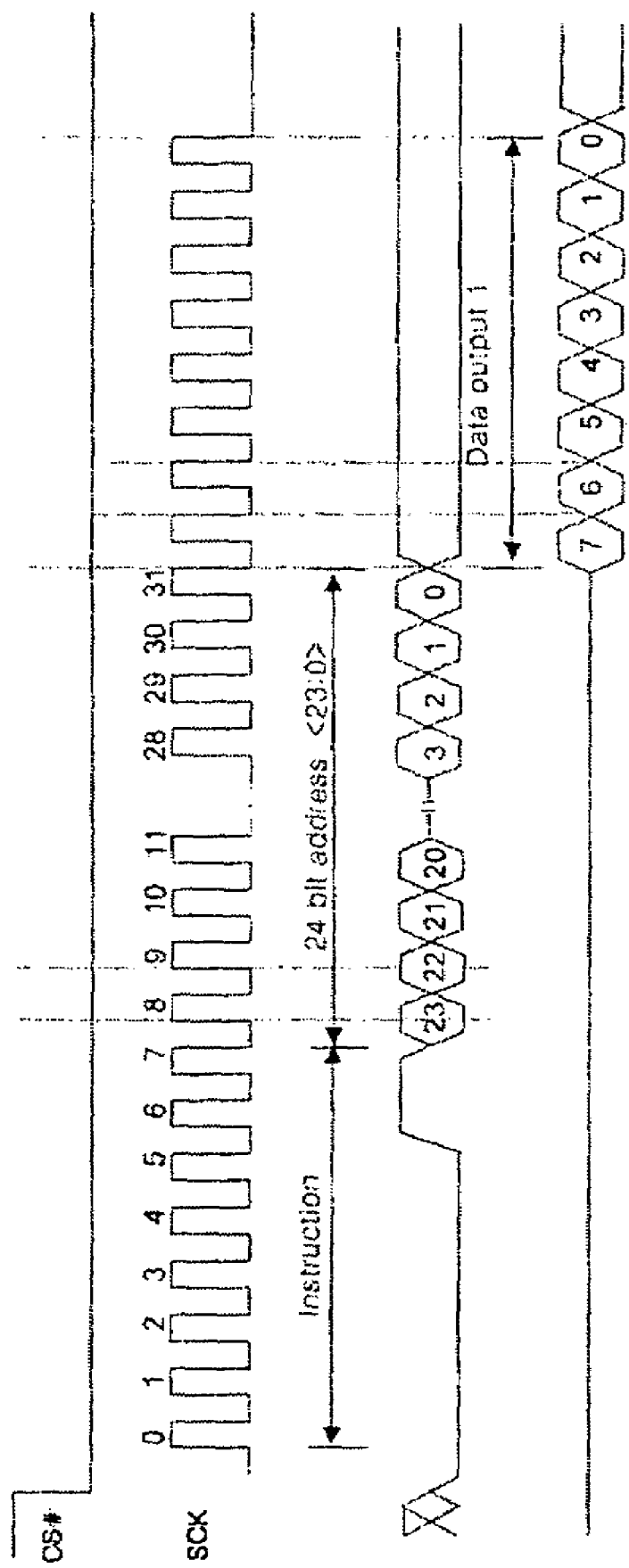
[Fig. 4]

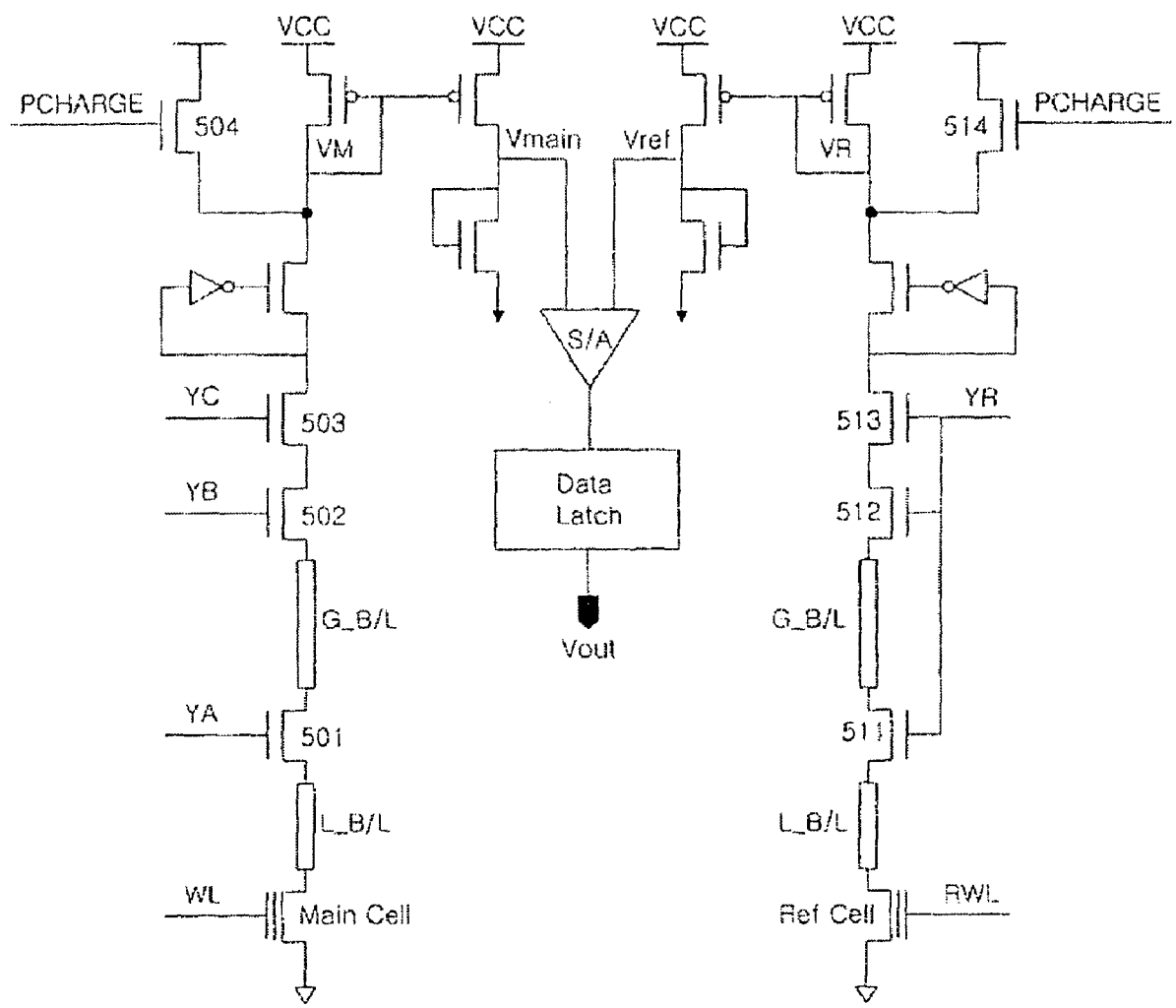
[Fig. 5]

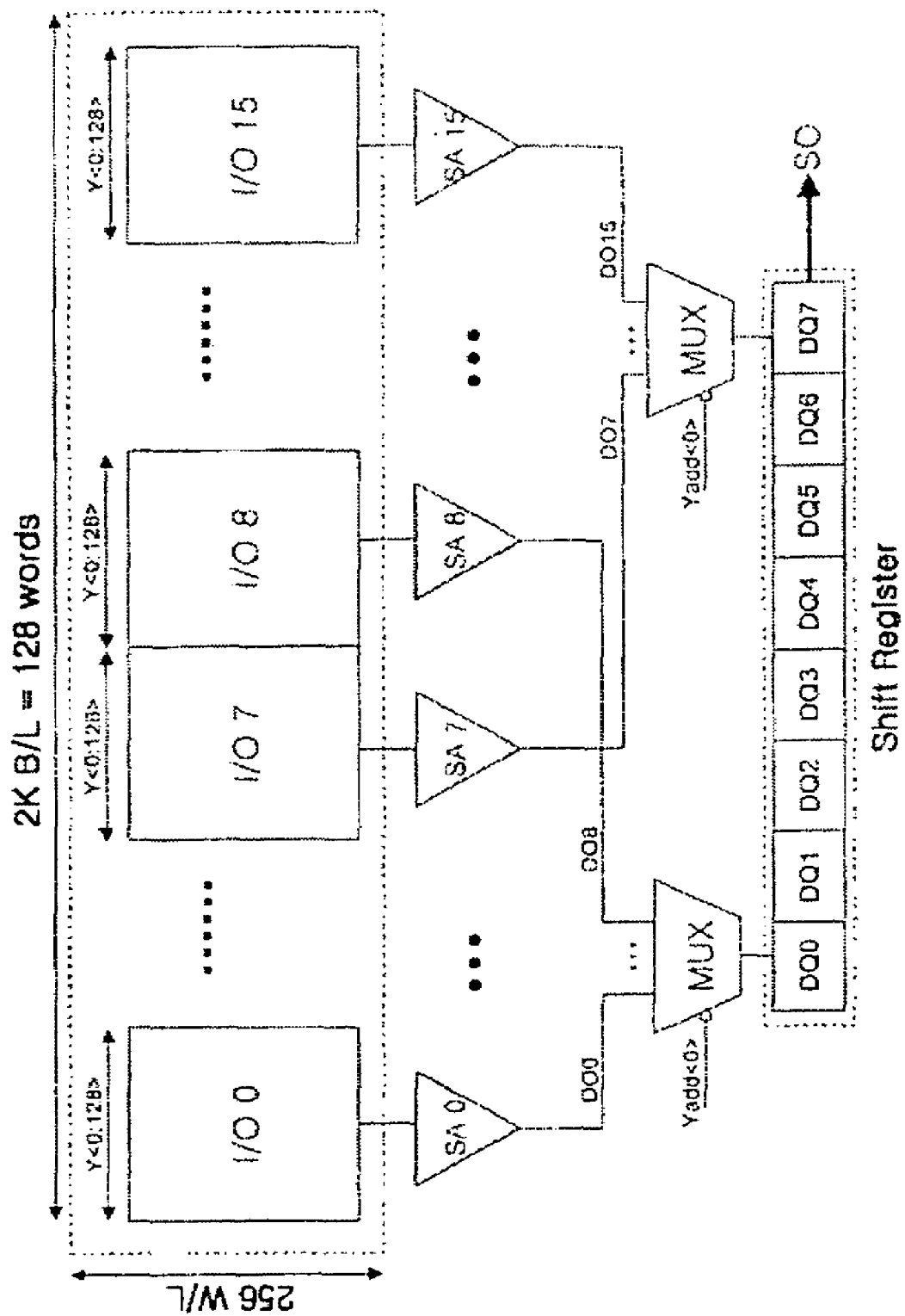

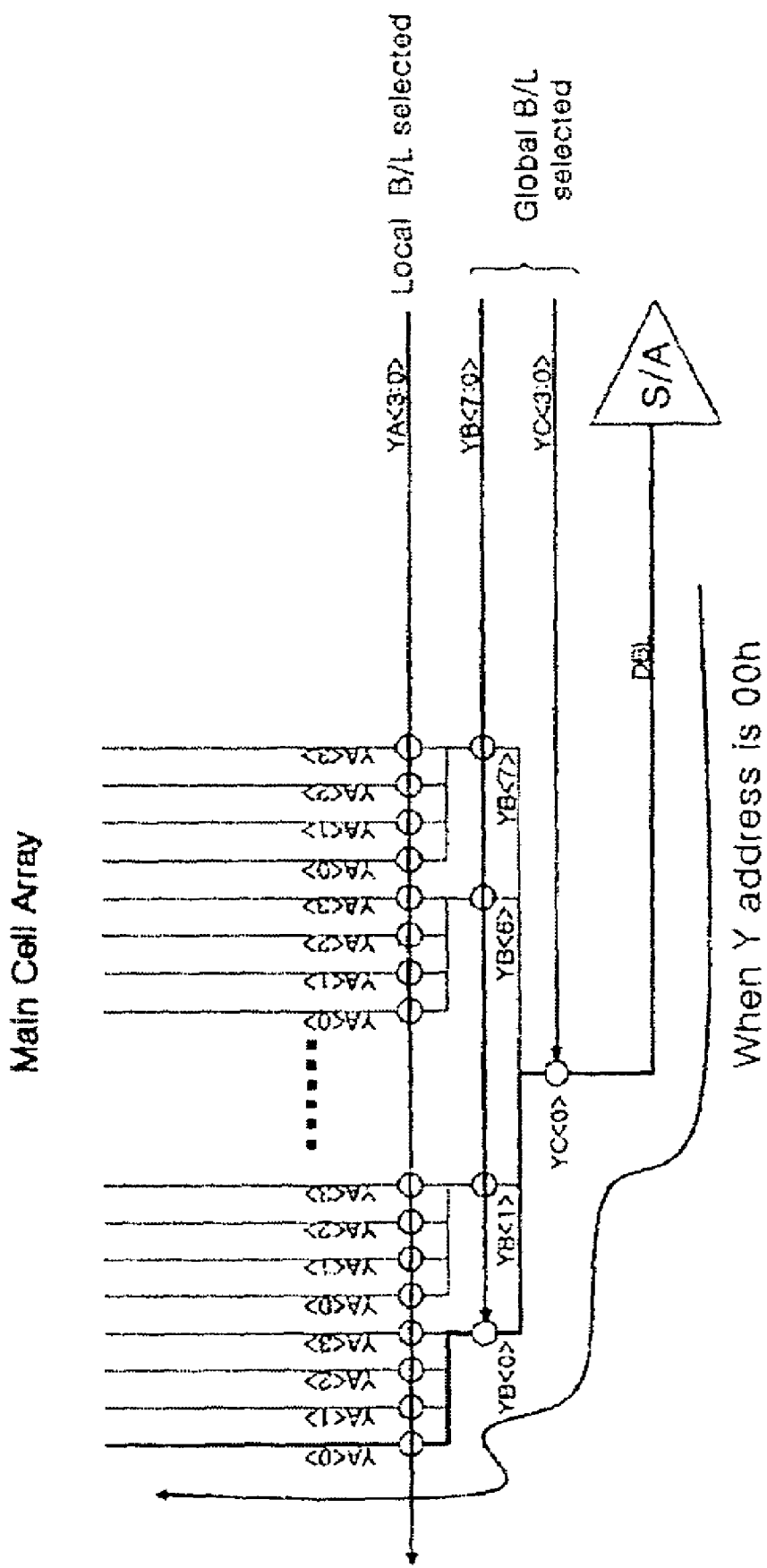
[Fig. 7]

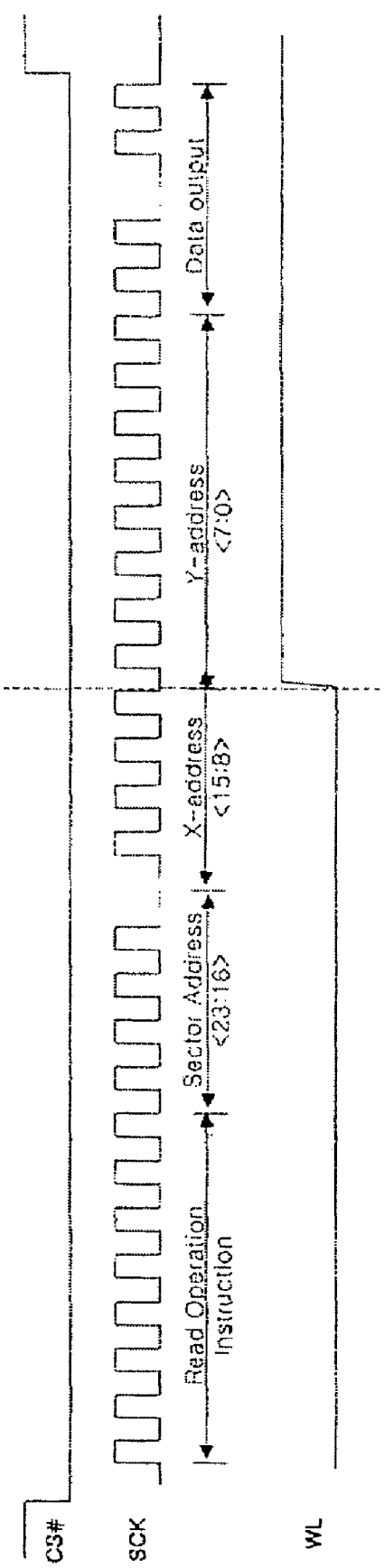

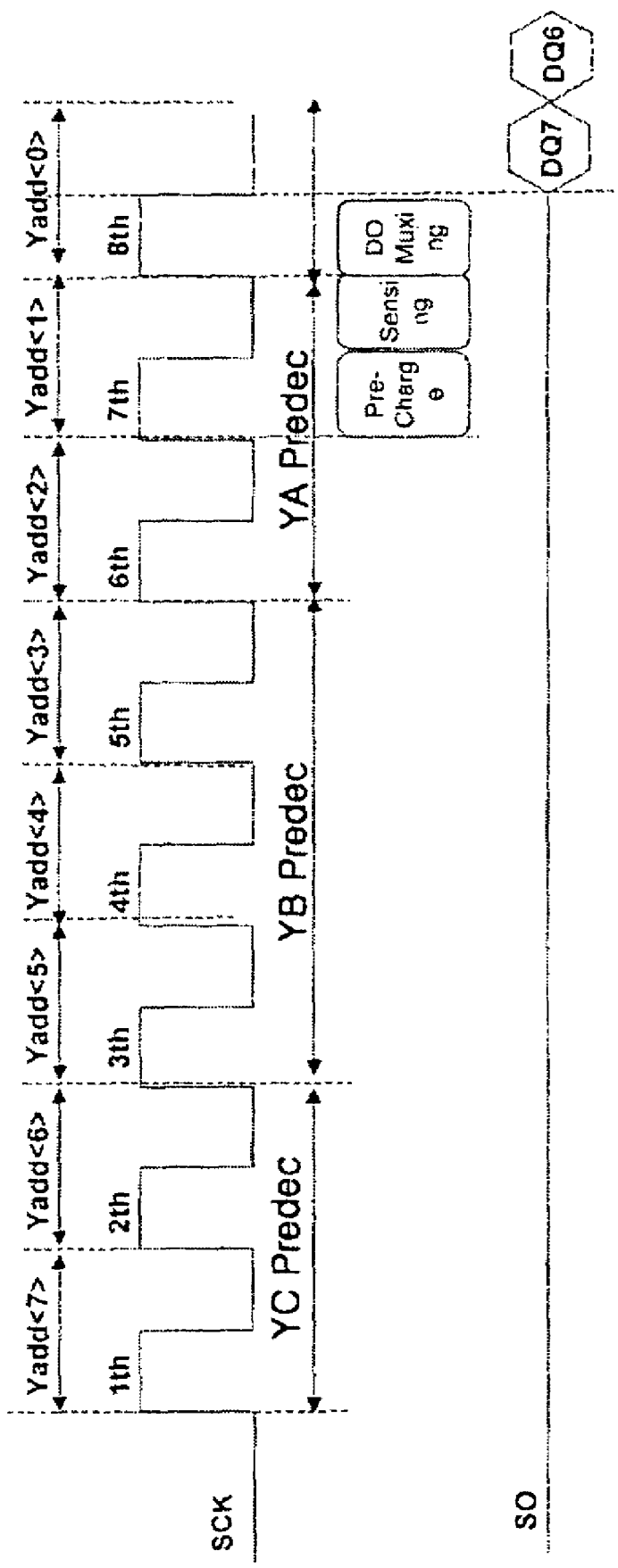
[Fig. 9]

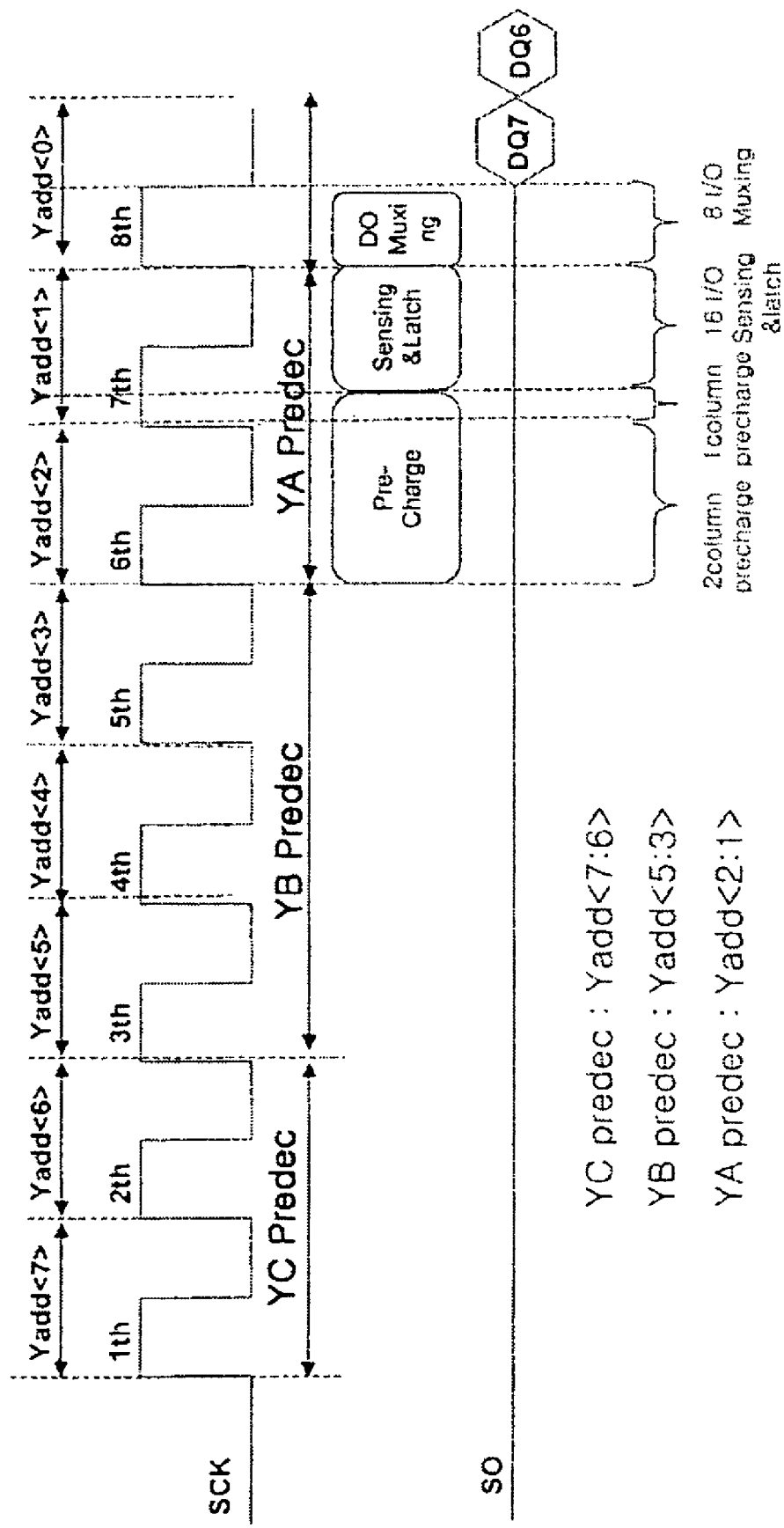

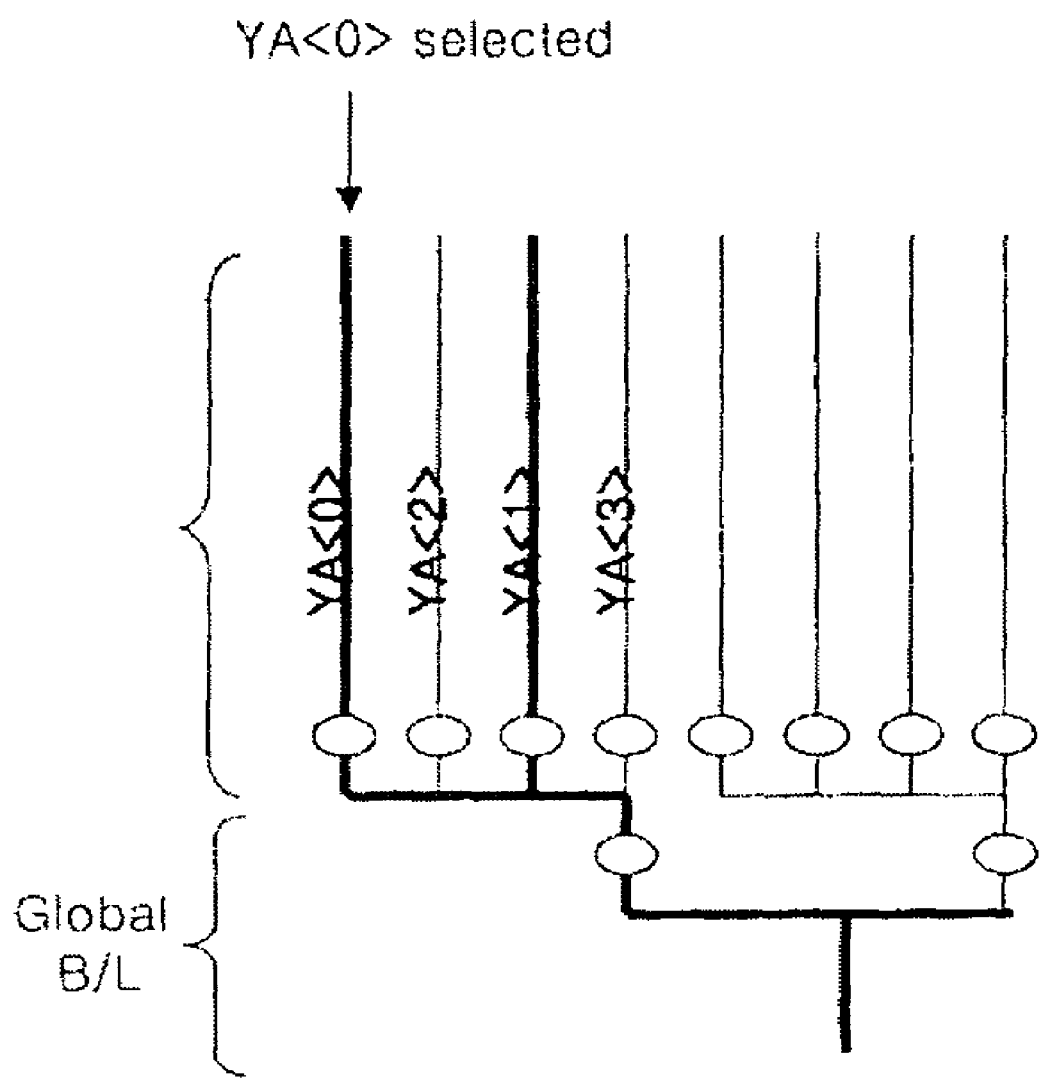
[Fig. 11]

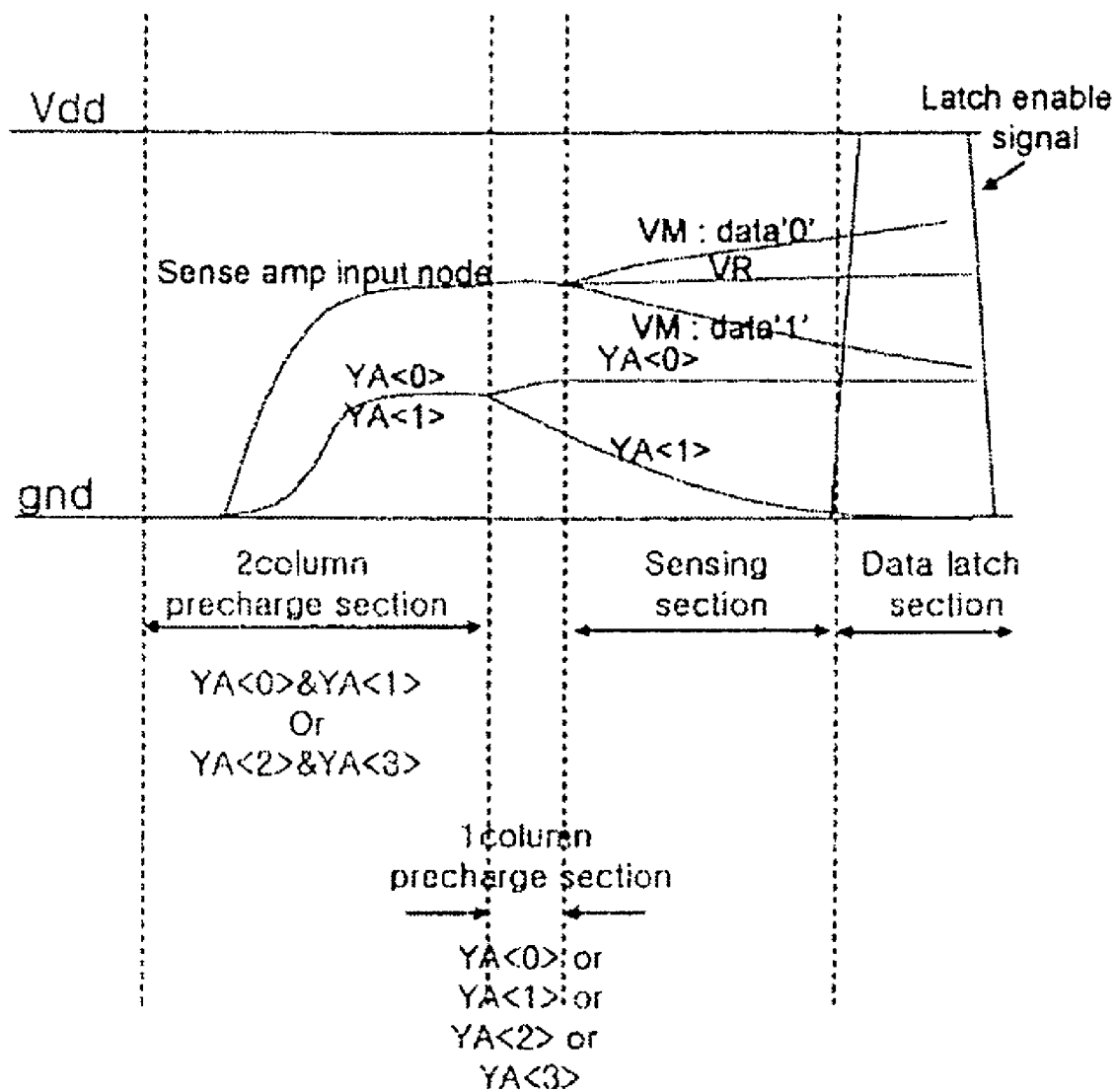

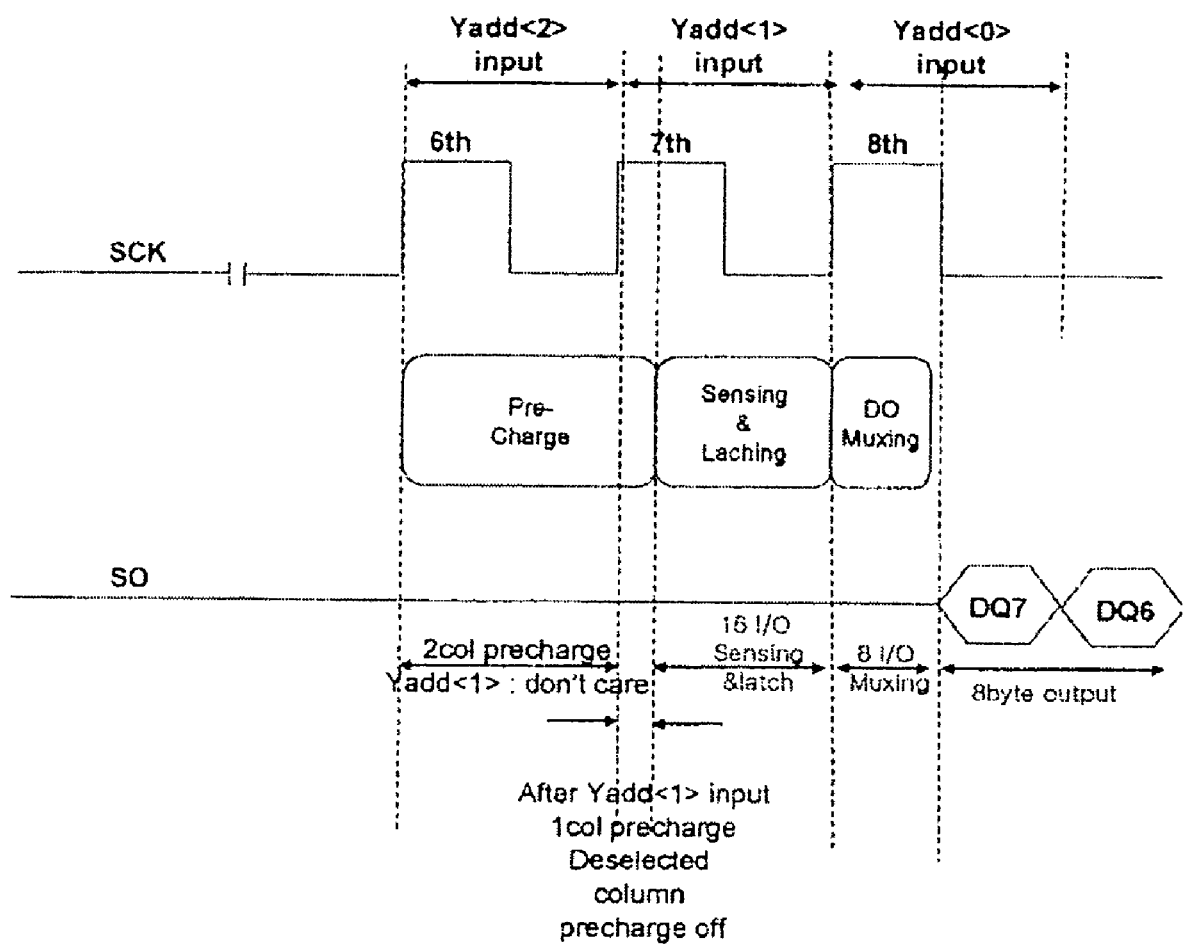

[Fig. 14]
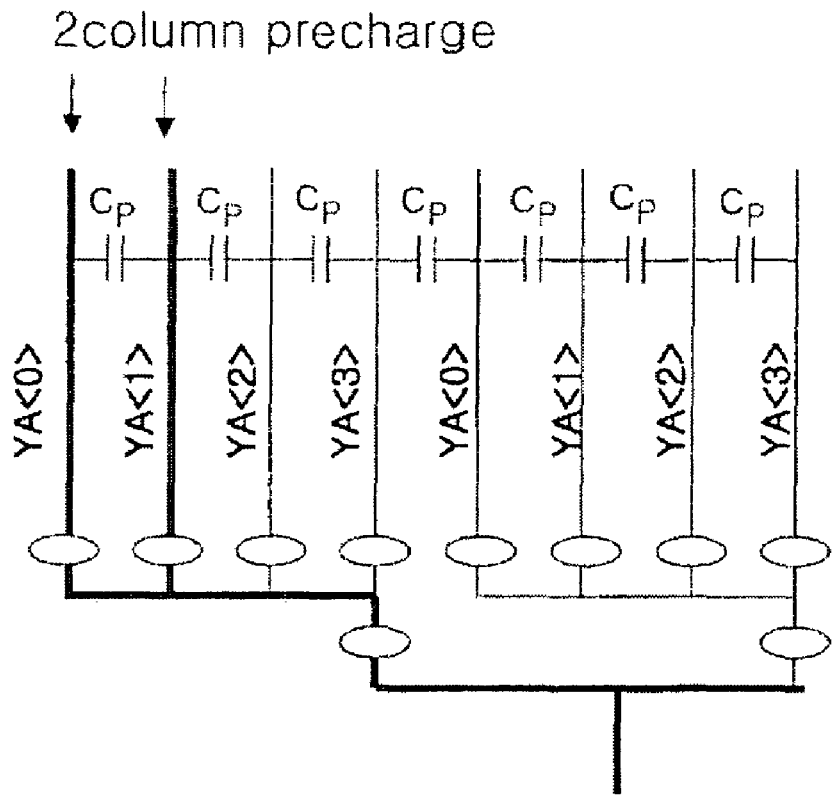
[Fig. 15]
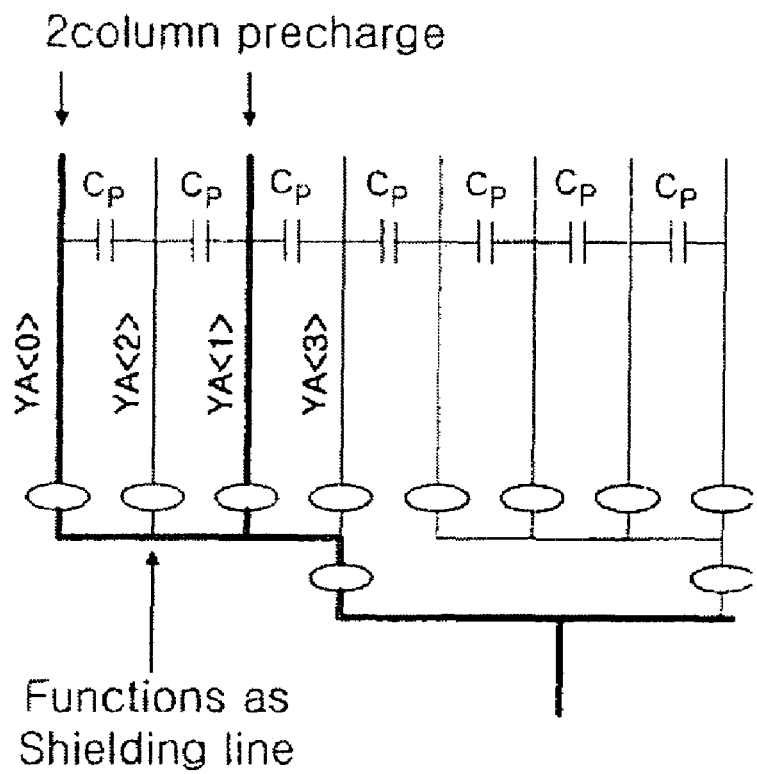

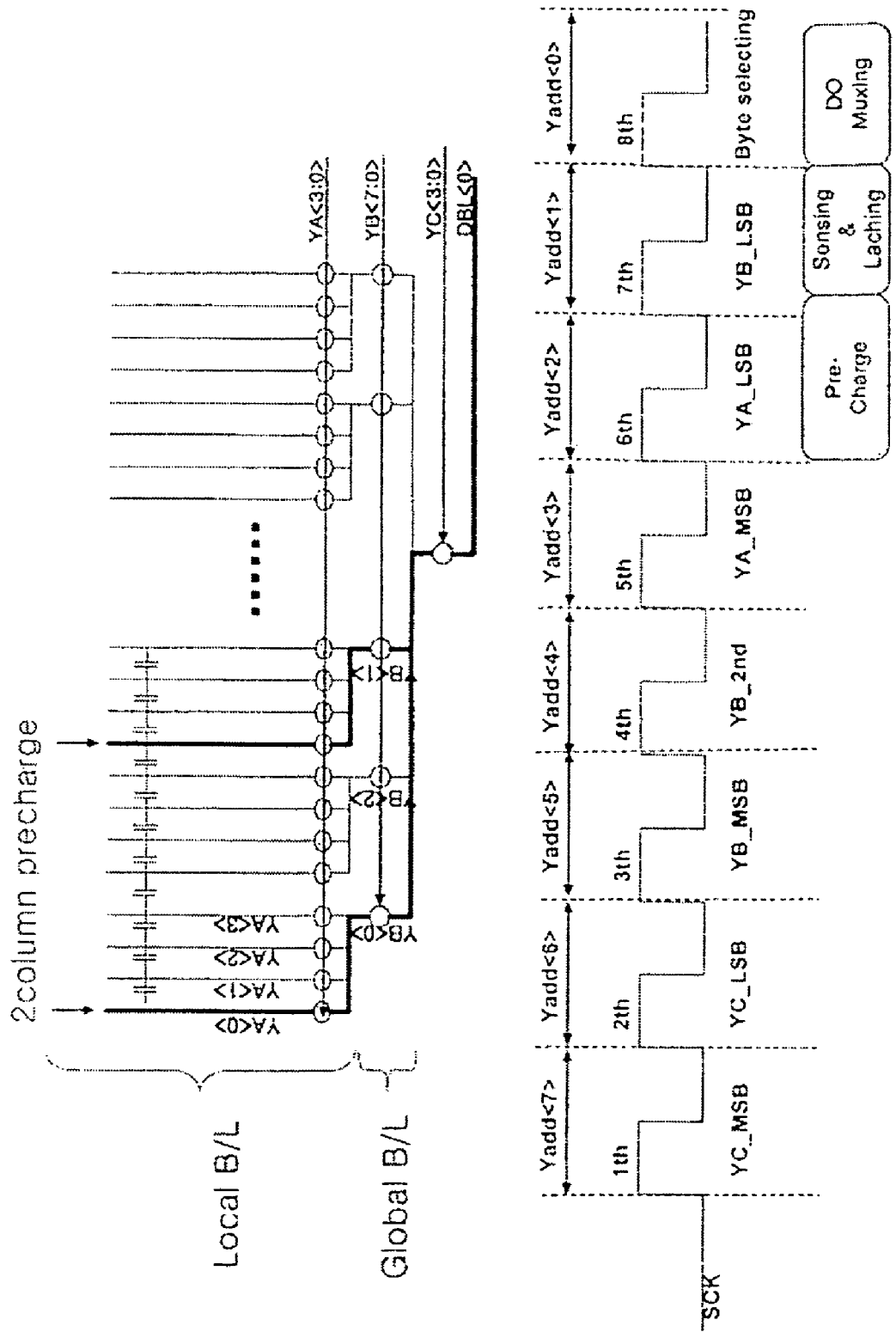
[Fig. 16]

SERIAL FLASH MEMORY DEVICE AND PRECHARGING METHOD THEREOF

TECHNICAL FIELD

The present invention relates to a flash memory device, and more particularly, to a two-column precharging method of a flash memory device with a serial input/output interface.

BACKGROUND ART

A Hash memory device is a nonvolatile memory device, which can store data for a long period without the supply of power. In the flash memory device, the data is stored in cells having floating gate transistors, and the data can be written and erased by an electrical programming and erasing operation.

FIG. 1 is a sectional diagram showing a stack-gale type flash memory cell known in the art. In a stack-gate type flash memory cell 100 shown in FIG. 1, a source region 3 and a drain region 4 are formed on a semiconductor substrate 1 with a channel region 2 interposed therebetween, and a tunnel oxide layer 5, a floating gate 6, a dielectric thin film 7, and a control gale 8 are stacked on the channel region 2 in this order. The dielectric thin film 7 is formed of an oxide-nitride-oxide (ONO) film. The source and drain regions 3 and 4 form a junction stricture of an N+ region and an N– region by using a spacer 9. The drain region 4 is connected to a bit-line 11 through a bit-line contact region 10.

FIG. 2 is a diagram showing a memory array constituting an NOR type flash memory cell. When the electrical programming operation is performed on an NOR type flash memory cell, a high voltage of 9V or more is supplied to word lines WL0 to W13 and a voltage of 4V or more is supplied to bit-lines BL0 to BL3. Accordingly, electrical current flows to the channel region 2 and hot-electrons generated in this process are injected to the floating gate 6, thereby increasing a threshold voltage of the flash memory cell. When the electrical erasing operation is performed on the NOR type flash memory cell, a negative voltage is supplied to the word lines WL0 to WL3 and a positive high voltage is supplied to the substrate 1 (or 'bulk' in FIG. 1). Accordingly, excess electrons accumulated in the floating gate 6 are discharged toward the channel region 2 through the tunnel oxide layer 5, thereby decreasing the threshold voltage of the cell.

Examples of external interfacing methods of addresses and commands to write and read data to and from the flash memory cell include a parallel interfacing method and a serial interfacing method.

A parallel interlace refers to an interface in which addresses, commands, and data are concurrently input and the data stored in the same address are also concurrently output. More specifically, in the case of an 'x16' operation for outputting sixteen data, addresses are concurrently input and sixteen data from DQ0 to DQ15 are concurrently output at a time within a predetermined period of time, i.e., tACC (Address to Output Delay).

On the other hand, a serial interlace refers to an interface in which addresses, commands, and data are sequentially input through a single pin and the data is sequentially output through the single pin.

FIG. 3 is a timing diagram of a serial peripheral interface (SPI) as an example of the serial interlace.

Referring to FIG. 3, an SPI interface uses only four pins that are CS#, SCK, SI and SO. The CS# pin receives a chip select signal for enabling or disabling a chip. The SCK pin receives a data clock signal for synchronizing input or output of data. The SI pin is a serial input pin for inputting addresses, commands or data. The SO pin is a serial output pin for outputting the data stored in the chip. The SPI interface includes one SI pin and one SO pin and therefore all the data are input and output through the SI and SO pins.

The basic principle of operation of the SPI interface is that after the CS# signal is changed to a logic low state, the SCK clock signal is activated and a command signal is input to the SI pin. The command signal is generally one byte signal. The input data to the SI pin is synchronized with a rising edge of the clock signal input to the SCK pin and the output data to the SO pin is synchronized with a falling edge of the clock signal input to the SCK pin.

FIG. 4 is a timing diagram showing a read operation of an SPI interface flash memory cell.

Referring to FIG. 4, a chip is selected when the CS# signal transits from a logic high state to a logic low state. A read instruction is input within the first eight (8) SCK clocks with the command value synchronized with the SCK clock. Thereafter, twenty-four address values are sequentially input in synchronization with the SCK clock. The first eight of the first twenty-four address values are usually used as a sector address for selecting a sector. The next eight addresses are used as an X address for selecting a word line WL and the last eight address are used as a Y address for selecting a bit-line B/L. After the twenty-fourth address is input, read data is output through the SO pin in synchronization with the falling edge of die SCK clock and the output data is sequentially output from MSB to LSB.

FIG. 5 is a circuit diagram showing an exemplary bit-line architecture and a sensing scheme for a flash memory cell.

FIG. 5 illustrates a hierarchical bit-line structure including a global bit-line G_B/L and a local bit-line L_B/L. One bit-line is selected by switching transistors 501, 502, and 503 which are turned on by column select signals YC, YB, and YA generated from a Y decoder (not shown). The YC signal and YB signal are signals for selecting the global bit-line G_B/L and the YA signal is a signal for selecting one of a plurality of local bit-lines L_P/L connected to one global bit-line G_B/L.

In the flash memory cell, the threshold voltage of the cell is varied by the number of electrons stored in the floating gate 6 in FIG. 6 and data is sensed depending on the amount of current flowing in the cell. In order to sense the data, an operation of precharging the bit-line WL to a predetermined voltage level needs to be performed in advance. When a precharge signal PCHARGE is enabled, a transistor 504 connected to a main cell Main Cell and a transistor 514 connected to a reference cell Ref Cell are turned on. Thereafter, the global bit-lines G_B/L and the local bit-lines L_B/L connected to the main cell and the reference cell are precharged to the predetermined voltage level by the switching transistors 501, 502, and 503 selected by the column select, signals YC, YB, and YA and switching transistors 511, 51.2, and 513 selected by a reference column select signal YR.

After completing the precharging operation, the precharge mode is disabled and a sensing operation is initiated. In an erased cell, since the threshold voltage of the cell is lower than the word line WL voltage, the cell is tinned on and a current flows in the cell, thereby decreasing the voltage level of a VM node to a level lower than the precharge level. On the other hand, in a programmed cell, since the threshold voltage of the cell is higher than the word line WL voltage, the cell is turned off and no current flows in the cell, thereby increasing the voltage level of the VM node to a level higher than the precharge level. A sense amplifier S/A senses and amplifies the VM node and the VR node when the voltage level of the VM node is increased (developed) to a suitable level.

FIG. 6 is a block diagram showing a data output path of a serial interface flash memory cell.

In an exemplary architecture shown in FIG. 6, one sector is formed of 2048 columns and 256 rows. The 2048 columns are divided into sixteen (16) I/O groups. When address signals are input, data is sensed by sixteen sense amplifiers S/A0 to S/A15. The high half bytes DO15 to DO8 or the low half bytes DO7 to DO0 of sixteen output signals from the sense amplifiers S/A0 to S/A15 is selected by an address signal Yadd<0>. The selected eight data is input to a shift register and then sequentially output from MSB to LSB in synchronization with the falling edge of the SCK clock.

FIG. 7 is schematic diagram showing a bit-line precharging scheme known in the art.

Referring to FIG. 7, after the entire Y addresses YA<3:0>, YB<7:0>, and YC<3:0> for selecting the bit-line WL are input, one local bit-line L_B/L and one global bit-line G_B/L connected to the switching transistors are precharged.

FIG. 8 is a timing diagram showing a word line enabling operation of an SP1 interface flash memory cell.

Referring to FIG. 8, a read operation instruction is followed by a sector address <23:16> constituting a first byte, an X address <15:8> constituting a second byte, and a Y address <7:0> constituting a third byte. The word line can be enabled after the entire X addresses are input.

FIG. 9 is a timing diagram showing respective timings for precharging, sensing, and latching in a serial interface flash memory cell.

Referring to FIG. 9, the Y addresses are selectively assigned for predecoding of the column select signals YA, YB, and YC. More specifically, the Yadd<7:6> addresses are assigned for YC predecoding, the Yadd<5:3> addresses are assigned for YB predecoding, and the Yadd<2:1> addresses are assigned for YA predecoding. The Yadd<0> address is assigned for selecting one byte of 16 output signals from the sense amplifiers S/A0 to S/A15.

In the prior scheme where only one bit-line B/L selected by the Y addresses is precharged and sensed, the entire address signals, i.e., Yadd<7:1>, need to be input before the one bit-line WL selected from the 128 bit-lines is precharged. In other words, the precharging operation is not performed until the seventh bit of the Y address is input. After completing the precharging operation, precharged transistors are turned off and thereafter a sensing operation and a latching operation are performed on the data.

After the eighth bit of the Y address is input, it is possible to select the high half bytes or the low half bytes of the sixteen sensed data. Using the eighth Y address signal, the data output are multiplexed and only the last eight data are output to the shift register, thereby outputting the data in synchronization with the falling edge of the SCK clock.

Therefore, in the prior precharging method in which one bit-line is precharged, the operations of precharging, sensing and data output multiplexing need to be completed in 1.5 clocks after the seventh Y address is input. In general, since the precharging time ranges from about 15 ns to about 30 ns and the sensing time ranges from about 10 ns to about 20 ns, the precharging operation and the sensing operation require a total operation time ranging from about 25 ns to about 50 ns.

However, when a frequency of the SCK clock is increased for a high-speed operation, for example, when the frequency of the SCK clock is increased to 40 MHz or more, one clock period of the SCK clock is decreased to 25 ns or less. Accordingly, the time for performing the precharging operation and the sensing operation is insufficient, and it is impossible to complete the operations.

DISCLOSURE OF INVENTION

Technical Problem

The present invention is contrived to solve, the above-mentioned problem. An advantage of the present invention is that it provides a two-column precharging method of a serial flash memory device.

Another advantage of the present invention is that it provides a serial memory device for performing a two-column precharging scheme and operable in high frequency.

Technical Solution

According to an aspect of the invention, there is provided a method of precharging a serial flash memory device in which a single local bit-line data is sensed in synchronization with a clock, the method including: disprecharging two or more local bit-lines in synchronization with a first clock; and discharging one of the two local bit-lines in synchronization with a second clock and sensing and amplifying data of the other local bit-line.

In the embodiments of the present invention, the two or more precharged local bit-lines may not be adjacent to each other.

According to another aspect of the present invention, there is provided a serial flash memory device, including: local bit-lines connected to a plurality of memory cells; switching transistors connecting the local bit-lines to a global bit-line in response to a column select signal; and a precharge transistor precharging the global bit-line in response to a precharge signal. In addition, the global bit-line is precharged by connecting two or more of the local bit-lines to the global bit-line when the column select signal and the precharge signal are activated at a first clock. In addition, one of the two local bit-lines is disprecharged when the column select signal is inactivated at a second clock.

In the embodiments of the present invention, serial flash memory device may include a sense amplifier sensing and amplifying data of the global bit-line. The sense amplifier may sense and amplify data of the other local bit-line at the second clock.

In the embodiments of the present invention, even numbered local bit-lines are respectively coupled to even numbered local bit-lines, and odd numbered local bit-lines are respectively coupled to odd numbered local bit-lines, so that the local bit-lines are not adjacent to each other when addressed by the column select signal.

According to still another aspect of the present invention, there is provided a serial flash memory device, including: local bit-lines connected to a plurality of memory cells; first switching transistors connecting the local bit-lines to first global bit-lines in response to a first column select signal; second switching transistors connecting the first global bit-lines to second global bit-lines in response to a second column select signal; and precharge transistors precharging the second global bit-lines in response to a precharge signal, In the present invention, two or more of the first local bit-lines are connected to the second global bit-lines when the second column select signal is activated at a first clock. In addition, one of the two local bit-lines is connected to the first global bit-line when the first column select signal is activated at a second clock. In addition, one of the two global bit-lines is disprecharged when the second column select signal is inactivated at a third clock.

In the embodiments of the present invention, the serial flash memory device may include a sense amplifier sensing and amplifying data of the second global bit-line. The sense amplifier may sense and amplify data of the local bit-line connected to the other first global bit-line at the third clock.

In the embodiments of the present invention, two or more of the first global bit-lines connected to the second global bit-line at the first clock may not be adjacent to each other.

According the serial flash memory device of the present invention, after two local bit-lines are precharged at a first clock, one of the two local bit-lines are disprecharged at a second clock and the other local bit-line is sensed and amplified. Accordingly, according to the method of precharging the serial flash memory device of the present invention, it is easy to secure the time for performing the precharging operation and the sensing operation, compared to the prior precharging method in which corresponding local bit-lines are precharged at every clock. In addition, according to the serial flash memory device of the present invention, since two precharged local bit-lines are not adjacent to each other, it is possible to eliminate a coupling noise effect.

BRIEF DESCRIPTION OF THE DRAWINGS

The above and other features and advantages of the present invention will become more apparent by describing in detail exemplary embodiments thereof with reference to the attached drawings in which:

FIG. 1 is a sectional diagram showing a stack-gate type flash memory cell known in the art;

FIG. 2 is a diagram showing a memory array constituting an NOR type flash memory cell;

FIG. 3 is a timing diagram of a serial peripheral interface (SPI) as an example of the serial interface;

FIG. 4 is a timing diagram showing a read operation of an SPI interlace flash memory cell;

FIG. 5 is a circuit diagram showing an exemplary bit-line architecture and a sensing scheme for a flash memory cell;

FIG. 6 is a block diagram showing a data output path of a serial interlace flash memory cell;

FIG. 7 is schematic diagram showing a bit-line precharging scheme known in the art;

FIG. 8 is a timing diagram showing a word line enabling operation of an SPI interface flash memory cell;

FIG. 9 is a timing diagram showing respective timings for precharging sensing, and latching in a serial interface flash memory cell;

FIG. 10 is a timing diagram showing a two-column precharging scheme according to an embodiment of the present invention;

FIGS. 11 and 12 are diagrams showing the two-column precharging scheme in detail;

FIG. 13 is a timing diagram showing operations of precharging, sensing and data output multiplexing in the two-column precharging scheme;

FIGS. 14 and 15 are diagrams showing a bit-line-to-bit-line coupling noise in the two-column precharging scheme; and FIG. 16 is a timing diagram showing a two-column precharging scheme according to another embodiment of the present invention.

BEST MODE FOR CARRYING OUT THE INVENTION

Hereinafter, exemplary embodiments of the present invention will be described in derail with reference to the attached drawings so that those skilled in the art can easily put the invention into practice. However, the invention may be embodied in a variety of forms, but is not limited to the exemplary embodiments. Like reference numerals in the drawings denote like elements.

FIG. 10 is a timing diagram showing a two-column precharging scheme according to an embodiment of the present invention. Similar to FIG. 9, the assigning method of Y addresses for predecoding if the column select signals YA, YB, and YC, as described in FIG. 9 is applied to FIG. 10. That is, the Yadd<7:6> addresses are assigned for YC predecoding, the Yadd<5:3> addresses are assigned for YB predecoding, and the Yadd<2:1> addresses are assigned for YA predecoding. The Yadd<0> address is assigned for selecting one byte of 16 output signals from the sense amplifiers S/A0 to S/A15.

Referring to FIG. 10, the precharging operation is initiated at the sixth SCK clock signal in which the Yadd<2> address, i.e., the MSB of the YA signal is input. More specifically, since the predecoding operation is performed using only the MSB address of the YA signal at the sixth Y address clock before the seventh LSB address of the YA signal, two of the four local bit-lines are concurrently precharged. Thereafter, when the seventh LSB address of the YA signal is input, an unselected one of the two precharged local bit-lines is disprecharged (i.e., precharged off) and selected tire other precharged local bit-line remains in a precharged state.

A few nanosecond (ns) would be sufficient for disprecharging the other local bit-line which is finally selected when the LSB address of the YA signal is input at the seventh Y address clock, among the two local bit-lines that are precharged at the sixth Y address clock. Therefore, this time period is used for maintaining the precharged state of one column (or bit-line). When the unselected column is completely disprecharged, a transistor (504 in FIG. 5), for example, is disabled and a sensing operation is initiated.

When the sensing operation is completed, the sensed data is latched. When the Yadd<0> address is input at the eighth Y address clock, the data output is multiplexed into the shift register and the data is output in synchronization with the falling edge of the SCK clock signal.

According to the present embodiment, since the precharging operation is initiated one clock ahead, compared to that of the prior art, the precharging time can be considerably shortened, thereby enabling a high-speed operation. In general, since the time for disprecharging the local bit-line unselected at the seventh Y address clock ranges from about 5 ns to about 8 ns and the time for the sensing and latching operation ranges from about 10 ns to about 20 ns, one clock period of the SCK clock can be decreased to about 15 ns (66 MHz), thereby enabling a high-speed operation.

FIGS. 11 and 12 are diagrams showing the two-column precharging scheme in detail, in which the local bit-line at YA<0> address is finally selected.

Referring to FIG. 11, when the sixth Y address is input, the LSB address of the YA signal is in the "don't care" state and the local bit-lines at YA<0> address and YA<1> address are concurrently precharged. Thereafter, when the Yadd<0> address is input at the seventh Y address clock, the local bit-line at YA<1> address is disprecharged. The local bit-line at YA<0> address remains at a precharge section for about a few nanosecond (ns). Then, the sensing operation is initiated when the YA switching transistor is completely turned off.

In FIG. 12, it is assumed that cell transistors connected to the local bit-line at YA<1> address are in an erased state. Since, the cell transistors are in the ON-state when the word line W/L is enabled, the local bit-line at YA<1> address is discharged to a ground voltage gnd through the cell transistor.

When the sensing operation is initiated, electrical current flows to the selected cell transistors through the local bit-line at YA<0> address and the input level of the sense amplifier S/A is changed depending on whether the cell is in an erased or programmed state. More specifically, when the cell is in the programmed state, the cell transistors are in the OFF-state, thereby increasing the input level at the VM node of the sense amplifier S/A. On the other hand, when the cell is in the erased state, the cell transistors are in the ON-state, thereby decreasing the input level at the VM node of the sense amplifier S/A. After performing the sensing operation for a predetermined period of time, the sense amplifier S/A senses and amplifies the data and the sensed output data are latched by enabling a latch enable signal.

FIG. 13 is a timing diagram showing operations of precharging, sensing and data output multiplexing in the two-column precharging scheme.

Referring to FIG. 13, the two-column precharging operation is initiated at the sixth Y address clock and the sensing operation and the latching operation are initiated at the seventh Y address clock. When the data output are multiplexed at the eighth Y address clock, the MSB data DQ7 is output in synchronization with the falling edge of the eighth Y address clock. Thereafter, subsequent data DQ6, DQ5, . . . , and so on are sequentially output.

FIGS. 14 and 15 are diagrams showing a bit-line-to-bit-line coupling noise in the two-column precharging scheme.

Referring to FIG. 14, when the Y addresses are assigned to the local bit-lines in the order from YA<0> to YA<3> and the unselected local bit-lines are discharged, the selected local bit-lines are influenced by a coupling noise effect. Therefore, the coupling noise deteriorates a sensing margin.

In the Y addresses shown FIG. 15, even numbered local bit-lines are respectively coupled to even numbered local bit-lines, and odd numbered local bit-lines are respectively coupled to odd numbered local bit-lines, so as to form the Y addresses. That is, the local bit-lines are arranged in the order of YA<0>, YA<2>, YA<1>, and YA<3>. Therefore, when the local bit-lines at YA<0> and YA<1> addresses are precharged and thereafter the local bit-line at YA<1> address is discharged, since the local bit-line at YA<2> address Junctions as a shielding line, the local bit-line at: YA<0> address does not cause the coupling noise to the local bit-line at YA<1> address.

FIG. 16 is a timing diagram showing a two-column precharging scheme, according to another embodiment of the present invention.

Referring to FIG. 16, the Y addresses are selectively assigned for predecoding of the column select signals YA, YB, and YC. More specifically, the Yadd<7:6> addresses are assigned for YC predecoding, the Yadd<5,4,1> addresses are assigned for YB predecoding, and the Yadd<3:2> addresses are assigned for YA predecoding. The Yadd<0> address is assigned for selecting one byte of 16 output signals from the sense amplifiers S/A0 to S/A15.

Since the address signals for YA predecoding are already input at the sixth Y address clock, one local bit-line is selected from the four local bit-lines at the sixth Y address clock. However, since the LSB of the YB predecoding address for selecting the global bit-lines is input at the seventh Y address clock, two global bit-lines are precharged when the LSB of the YB predecoding is in the "don't care" state. Even when the LSB of the YB predecoding is input, at the seventh Y address clock and the unselected global bit-lines are discharged to the ground voltage gnd, the global bit-line at YB<2> address functions as the shielding line. Accordingly, it is possible to eliminate the coupling noise effect at the global bit-lines as well as at the local bit-lines.

INDUSTRIAL APPLICABILITY

According to the serial flash memory device of the present invention, after two local bit-lines are precharged at a first clock, one of the two local bit-lines are disprecharged at a second clock and data of the other local bit-line is sensed and amplified. Accordingly, according to the serial flash memory device and precharging method thereof of the present invention, it is easy to secure the time for performing the precharging operation and the sensing operation, compared to the prior precharging method in which corresponding local bit-lines are precharged at every clock.

In addition, according to the serial flash memory device of the present invention, since two precharged local bit-lines are not adjacent to each other, it is possible to eliminate a coupling noise effect.

Although the exemplary embodiments of the invention have been described in detail, the invention is not limited to the exemplary embodiments, but it will be understood by those skilled in the nil that various modifications, additions and substitutions are possible without departing from the scope and spirit of the invention as disclosed in the accompanying claims.

The invention claimed is:

1. A method of precharging a serial flash memory device in which a single local bit-line data is sensed in synchronization with a clock, the method comprising:
    precharging two or more local bit-lines in synchronization with a first clock; and
    disprecharging one of the two local bit-lines in synchronization with a second clock and sensing and amplifying data of the other local bit-line.

2. The method of claim 1, wherein, in the precharging operation, the two precharged local bit-lines are not adjacent to each other.

3. A serial flash memory device, comprising:
    local bit-lines connected to a plurality of memory cells;
    switching transistors connecting the local bit-lines to a global bit-line in response to a column select signal; and
    a precharge transistor precharging the global bit-line in response to a precharge signal,
    wherein the global bit-line is precharged by connecting two or more of the local bit-lines to the global bit-line when the column select signal and the precharge signal are activated at a first clock, and
    wherein one of the two local bit-lines is disprecharged when the column select signal is inactivated at a second clock.

4. The device of claim 3, further comprising a sense amplifier sensing and amplifying data of the global bit-line,
    wherein the sense amplifier senses and amplifies data of the other local bit-line at the second clock.

5. The device of claim 3, wherein the two or more local bit-lines precharged at the first clock are not adjacent to each other.

6. The device of claim 3, wherein even numbered local bit-lines are respectively coupled to even numbered local bit-lines, and odd numbered local bit-lines are respectively coupled to odd numbered local bit-lines, so that the local bit-lines are not adjacent to each other when addressed by the column select signal.

7. A serial flash memory device, comprising:

local bit-lines connected to a plurality of memory cells;

first switching transistors connecting the local bit-lines to first global bit-lines in response to a first column select signal;

second switching transistors connecting the first global bit-lines to second global bit-lines in response to a second column select signal; and precharge transistors precharging the second global bit-lines in response to a precharge signal, wherein two or more of the first local bit-lines are connected to the second global bit-lines when the second column select signal is activated at a first clock, wherein one of the two local bit-lines is connected to the first global bit-line when the first column select signal is activated at a second clock, and wherein one of the two global bit-lines is disprecharged when the second column select signal is inactivated at a third clock.

8. The device of claim 7, further comprising a sense amplifier sensing and amplifying data of the second global bit-line, wherein the sense amplifier senses and amplifies data of the local bit-line connected to the other first global bit-line at the third clock.

9. The device of claim 7, wherein two or more of the first global bit-lines connected to the second global bit-line at the first clock are not adjacent to each other.

* * * * *